United States Patent [19]
Vanderaar

[11] Patent Number: 5,910,967
[45] Date of Patent: Jun. 8, 1999

[54] PRAGMATIC ENCODER AND METHOD THEREFOR

[75] Inventor: Mark J. Vanderaar, Medina, Ohio

[73] Assignee: Sicom, Inc., Scottsdale, Ariz.

[21] Appl. No.: 08/954,550

[22] Filed: Oct. 20, 1997

[51] Int. Cl.[6] .............................. H04L 5/12; H03M 13/12
[52] U.S. Cl. .......................................... 375/265; 371/43.4
[58] Field of Search .................................. 375/265, 308, 375/261, 280; 371/37.05, 43.1, 43.4

[56] References Cited

U.S. PATENT DOCUMENTS

| | | | |
|---|---|---|---|
| 4,462,101 | 7/1984 | Yasuda et al. | 371/43 |
| 4,601,044 | 7/1986 | Kromer, III et al. | 375/17 |
| 5,233,629 | 8/1993 | Paik et al. | 375/39 |
| 5,233,630 | 8/1993 | Wolf | 375/67 |
| 5,396,518 | 3/1995 | How | 375/265 |
| 5,408,502 | 4/1995 | How | 375/340 |
| 5,428,631 | 6/1995 | Zehavi | 371/43 |
| 5,469,452 | 11/1995 | Zehavi | 374/43 |
| 5,633,881 | 5/1997 | Zehavi et al. | 371/37.5 |

OTHER PUBLICATIONS

Viterbi et al., "A Pragmatic Approach to Trellis–Coded Modulation", IEEE Communications Magazine, Jul. 1989, pp. 11–19.

Wolf and Zehavi, "P[2] Codes: Pragmatic Trellis Codes Utilizing Punctured Convolutional Codes," IEEE Communications Magazine, Feb. 1995, pp. 94–99.

M. Vanderaar et al., A Low Complexity Digital Encoder–Modulator for High Data Rate Satellite BISDN Applications, IEEE 1996, pp. 357–363.

Pietrobon et al., "Trellis–Coded Multidimensional Phase Modulation," IEEE Transactions on Information Theory, Jan. 1990, vol. 36 No. 1.

D. Delaruelle, "A Pragmatic Coding Scheme for Transmission of 155 Mbit/s SDH and 140 Mbit/S PDH Signals over 72 MHz Transponders", Proc. ICDSC–10, Brighton, May 1995.

Primary Examiner—Temesghen Ghebretinsae
Attorney, Agent, or Firm—Lowell W. Gresham; Jordan M. Meschkow; Meschkow & Gresham, P.L.C.

[57] ABSTRACT

A communication system (11) uses concatenated coding in which an inner code is configured to match the needs of an outer code. The inner code is implemented through a pragmatic trellis coded modulation encoder (18) and decoder (34). A parser (50) of the encoder (18) distributes fewer than one user information bit per unit interval (66) to a convolutional encoder (58) which generates at least two convolutionally encoded bits for each user information bit it processes. Exactly one of the convolutionally encoded bits is phase mapped (56) with at least two user information bits during each unit interval (66). The decoder (34) detects a frame sync pattern (48) inserted into the user information bits to resolve phase ambiguities. Phase estimates are convolutionally decoded (100) to provide decoded data estimates that are then used to selectively rotate the phase estimates prior to routing the phase estimates to a slice detector (118).

15 Claims, 4 Drawing Sheets

FIG. 3

PRAGMATIC ENCODER AND METHOD THEREFOR

RELATED APPLICATIONS

The present application is related to U.S. patent Ser. No. 08/912,155, entitled "System And Method For Communicating Digital Data While Resolving Phase Ambiguities," by Ronald D. McCallister, Bruce A. Cochran, and John M. Liebetreu; and to U.S. patent Ser. No. 08/912,225, entitled "Rotationally Invariant Pragmatic Trellis Coded Digital Communication System And Method," by Ronald D. McCallister, Bruce A. Cochran, and John M. Liebetreu.

TECHNICAL FIELD OF THE INVENTION

The present invention relates generally to the field of digital communications. More specifically, the present invention relates to encoders and decoders used in connection with pragmatic trellis coded modulation.

BACKGROUND OF THE INVENTION

Pragmatic trellis coded modulation (PTCM) has become popular because it allows a common basic encoder and decoder to achieve respectable coding gains for a wide range of bandwidth efficiencies (e.g. 1–6 b/s/Hz) and a wide range of higher order coding applications, such as 8-PSK, 16-PSK, 16-QAM, 32-QAM, etc. For lower order coding applications, such as QPSK or BPSK, PTCM offers no advantage because quadrature, complex communication signals provide two dimensions (i.e. I and Q) per unit baud interval with which to convey two or fewer symbols per unit interval.

In general, PTCM employs primary and secondary modulation schemes. The words "primary" and "secondary" do not indicate relative importance. Rather, the primary modulation is simply applied to a first set of information bits, and the secondary modulation is applied to a second set of information bits. The first set of information bits is phase mapped so that it perturbs the phase constellation to a greater degree than the second set of information bits. Conventionally, the secondary modulation scheme differentially encodes its subset of information bits, then encodes these differentially encoded bits with a strong error detection and correction code, such as the well known K=7, rate 1/2 "Viterbi" convolutional code (i.e. Viterbi encoding). The primary modulation scheme need do no more than differentially encode its subset of the information bits. The resulting symbols from the primary and secondary modulation schemes are then concurrently phase mapped to generate quadrature components of a transmit signal. The symbol data are conveyed through the phase and amplitude relationships between the quadrature components of the transmit signal.

Conventional pragmatic coding schemes phase map at least two secondary (i.e. convolutionally encoded) bits per unit baud interval with at least one primary (i.e. not convolutionally encoded) bit per unit baud interval. This produces markedly improved bit error rate (BER) performance in the face of increasing signal-to-noise ratio (e.g. energy per bit divided by noise, or $E_b/N_o$), particularly for higher coding rates, such as rate 5/6, 8-PSK, rate 8/9, 8-PSK, and the like. The coding rate (e.g. 5/6, 8/9, etc.) provides one indication of coding gain. In a rate 5/6 encoder, five user information bits are provided to the encoder for each six symbols generated by the encoder; and, in a rate 8/9 encoder, eight user information bits are provided to the encoder for each nine symbols generated by the encoder. Higher coding rates are desirable because more user information is communicated in a given time interval than with lower coding rates, all other parameters being equal.

FIG. 1 shows a curve 10 that illustrates typical conventional pragmatic, higher code rate, BER performance as a function of signal-to-noise ratio when at least two secondary bits per unit baud interval are mapped with at least one primary bit per unit baud interval. In short, the steep slope to the right of the curve 10 "knee" indicates that small improvements in $E_b/N_o$ yield massive improvements in BER. In order to achieve a very good BER, only a modest signal-to-noise ratio is required. However, the signal-to-noise ratio required to deliver only a modest BER is higher than desired, particularly at higher coding rates.

Another data communication coding technique that has become popular is concatenated coding. With concatenated coding, an inner code need deliver only a modest BER to an outer code, which then typically improves this modest BER by several orders of magnitude. In a typical scenario, an inner code may deliver a BER of $10^{-4}$ or better to an outer code, which then improves the overall BER to around $10^{-12}$. The outer code is typically provided through a block encoding/decoding scheme, such as the well known Reed-Solomon code. The inner code is typically provided through a convolutional encoder/decoder, such as the well known rate 1/2 Viterbi code. A common basic encoder and decoder can be used for a wide range of higher order coding applications when a pragmatic inner code is used.

When a pragmatic inner coding scheme is used, it desirably provides only the modest BER required by the outer coding scheme. Lower error rates than this modest BER do not lead to improved overall BER from the outer coding scheme. Rather, they are achieved at a cost of operating transmitters at higher power levels than required and at a cost of transmitting excessive energy which can interfere with the operation of adjacent communication channels. Unfortunately, this modest BER tends to be achieved by conventional pragmatic inner coding schemes that map at least two secondary bits per unit baud interval with at least one primary bit per unit baud interval at an undesirably high signal-to-noise ratio.

Carrier-coherent receiving schemes are often used with concatenated codes and with pragmatic codes because they demonstrate improved performance over differentially coherent receiving schemes. Coherent receivers become phase synchronized to the received signal carrier in order to extract the amplitude and phase relationships indicated by the quadrature components. However, an ambiguity results because the receiver inherently has no knowledge of an absolute phase reference, such as zero. In other words, for M-PSK where one of $2^K$ possible phase states are conveyed during each unit interval, where K equals the number of symbols conveyed per unit interval, then the receiver may identify any of the $2^K$ phase states as the zero phase state. This ambiguity must be resolved before the conveyed amplitude and phase data successfully reveal the information bits.

Conventionally, the differential encoding is applied to information bits at the modulator and differential decoding used in the demodulator to at least partially resolve the phase ambiguity. After the secondary modulation is decoded in the demodulator, the decoded secondary bits are then used to decode the primary modulation in a way that partially resolves the ambiguity.

However, the use of differential encoding is undesirable in resolving rotational ambiguity because when a single error occurs, two highly correlated errors are observed in the decoder. Consequently, a significant degradation of error probabilities results and BER suffers.

Accordingly, a need exists for a coding scheme which delivers a modest BER at a lower signal-to-noise ratio than required by conventional pragmatic inner coding schemes that map at least two secondary bits per unit interval with at least one primary bit per unit interval. Moreover, a need exists for a technique for resolving phase ambiguities without differentially encoding the user information.

SUMMARY OF THE INVENTION

Accordingly, it is an advantage of the present invention that an improved pragmatic encoder and encoding method are provided.

Another advantage of the present invention is that an encoder is provided which achieves a modest BER at a lower signal-to-noise ratio.

Another advantage of the present invention is that an encoder is provided which supports phase ambiguity resolution in a decoder without differentially encoding user information.

Another advantage of the present invention is that a concatenated encoder is provided which better matches inner and outer codes to achieve a desirable overall BER at a low signal-to-noise ratio.

The above and other advantages of the present invention are carried out in one form by a pragmatic encoding method for coding information bits to be digitally communicated at a rate of three or more bits per unit interval. The method calls for distributing a first portion of the information bits to a phase mapping circuit and a second portion of the information bits to a convolutional encoder. The first portion comprises at least two bits per unit interval and the second portion comprises less than one bit per unit interval. The second portion of the information bits is convolutionally encoded so that at least one convolutionally encoded bit is produced per unit interval. The first portion of the information bits and the convolutionally encoded bits are phase mapped so that no more than one convolutionally encoded bit is mapped per unit interval.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 2:
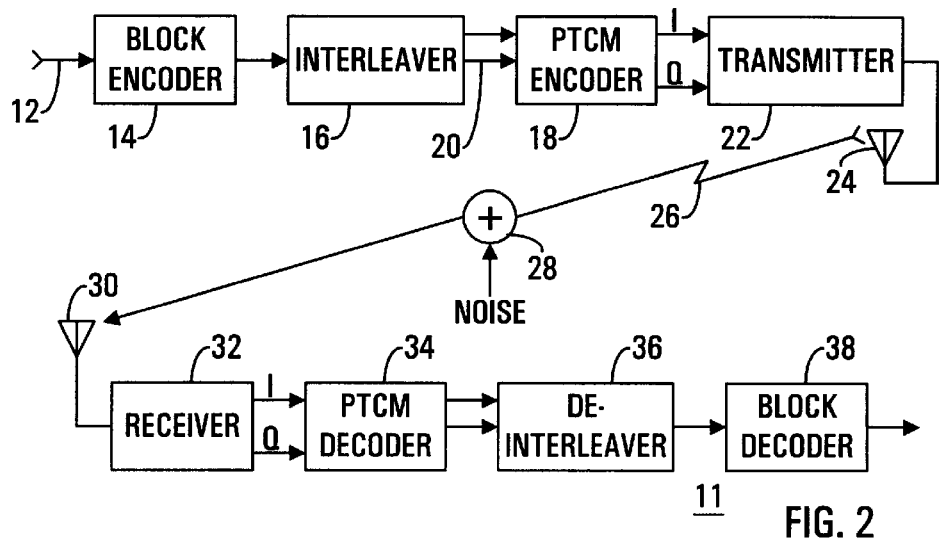
FIG. 2 shows a block diagram of a digital communication system configured in accordance with the teaching of the present invention.

FIG. 2 shows a block diagram of a digital communication system 11 configured in accordance with the teaching of the present invention. At a supply point 12, system 11 receives information bits or user data to be transmitted. Concatenated coding is implemented in the preferred embodiments. Accordingly, supply point 12 couples to an input of a block encoder 14. Block encoder 14 is preferably configured as a Reed-Solomon encoder. An output of block encoder 14 couples to an input of an interleaver 16, and outputs of interleaver 16 couple to an input of a pragmatic trellis coded modulation (PTCM) encoder 18. The outputs from interleaver 16 include user information bits 20 and a synchronizing signal indicates when a frame synchronization pattern should be inserted into information bits 20. PTCM encoder 18 is discussed in more detail below in connection with FIGS. 3–6.

PTCM encoder 18 generates phase point data that may be in the form of I and Q quadrature signals which are supplied to a transmitter 22. Transmitter 22 couples to an antenna 24 from which a digital communication signal 26 is broadcast through a communication channel 28. As illustrated in FIG. 2, digital communication signal 26 is invariably corrupted to some degree by noise within channel 28. This noise-corrupted digital communication signal 26 is received at an antenna 30 which couples to an input of a receiver 32. In the preferred embodiments, receiver 32 implements a carrier-coherent reception scheme. Receiver 32 produces rectilinear (i.e. I and Q) or polar (i.e. $\phi$ and M, not shown) quadrature components which are then supplied to a PTCM decoder 34. PTCM decoder 34 is discussed in more detail below in connection with FIGS. 7–9.

PTCM decoder 34 generates estimates of original information bits 20. In the preferred embodiments of the present invention two outputs of PTCM decoder 34 couple to an input of a deinterleaver 36, an output of which couples to an input of a block decoder 38. These two outputs convey data estimates and a frame synchronizing signal. Block decoder 38 is preferably implemented using a Reed-Solomon decoder.

Figure 1:
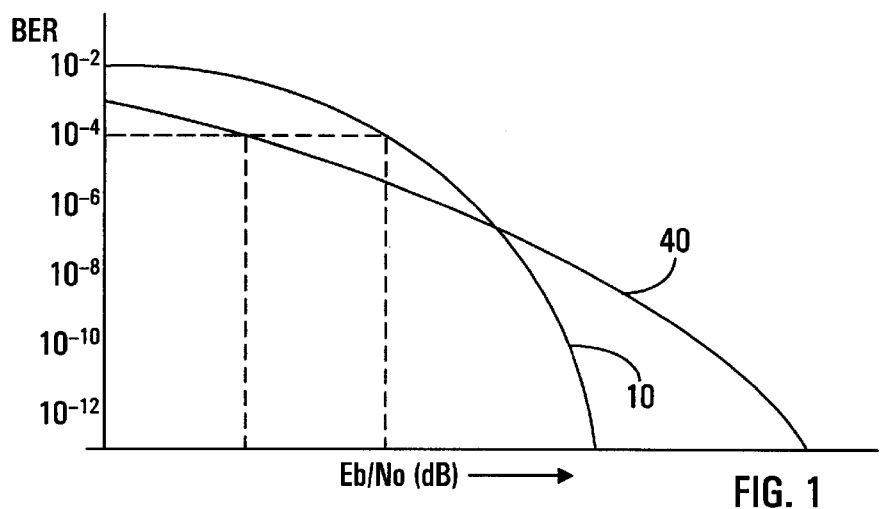
FIG. 1 is a graph that illustrates the signal-to-noise ratio advantage achieved by one embodiment of the present invention at modest BER in comparison with a prior art pragmatic coding digital communication technique.

Accordingly, communication system 11 encodes and decodes in accordance with a concatenated code. Reed-Solomon block coding provides an outer code, and PTCM provides an inner code. Referring to FIG. 1, a curve 40 represents the bit error rate (BER) performance achieved at varying signal-to-noise levels with the inner code implemented in accordance with the teaching of the present invention. A modest BER, such as $10^{-4}$, is achieved at an $E_b/N_o$ which is typically significantly lower than the $E_b/N_o$ required to achieve the same modest BER using a conventional pragmatic trellis coded modulator.

Figure 3:
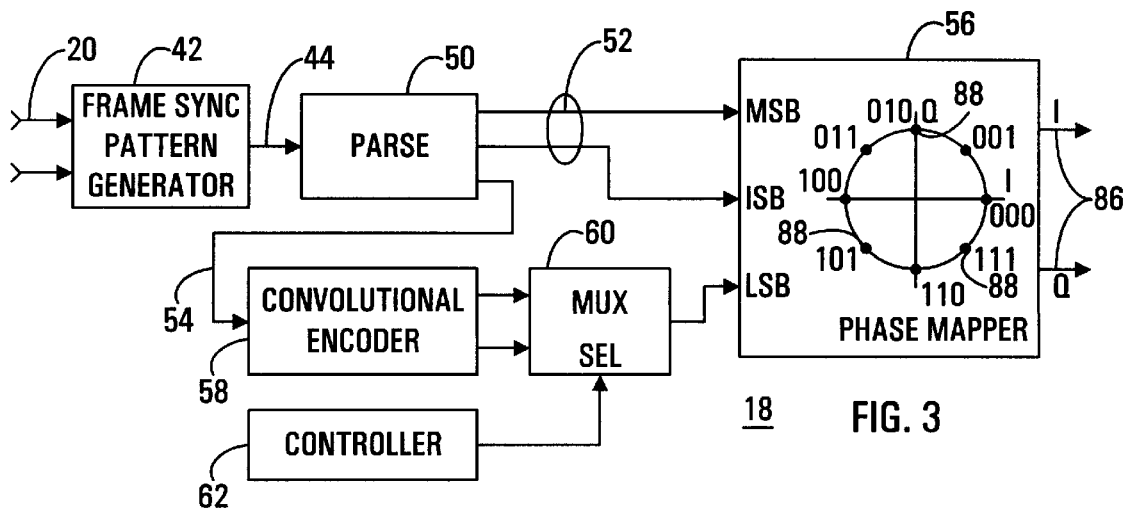
FIG. 3 shows a block diagram of a pragmatic trellis coded modulation (PTCM) encoder portion of the digital communication system.

FIG. 3 shows a block diagram of PTCM encoder 18 of digital communication system 11 (FIG. 2). Referring to FIG.

3, a stream of block encoded information bits 20 is supplied to an input of a frame synchronization (sync) pattern generator 42. Block encoded information bits 20 have been generated from block encoder 14 (FIG. 2) and temporally shifted through interleaver 16 (FIG. 2) prior to application to frame sync pattern generator 42. Frame sync pattern generator 42 periodically adds a predetermined frame synchronization data pattern to block encoded information bits 20 to produce a framed stream of information bits 44.

Figure 4:
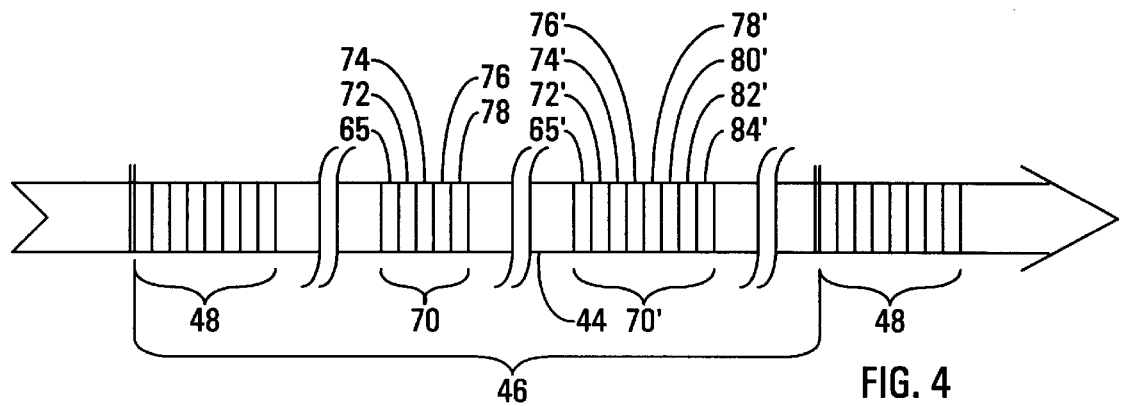
FIG. 4 shows a data format diagram that illustrates temporal framing used in accordance with the teaching of the present invention.

FIG. 4 shows a data format diagram that illustrates temporal framing used in accordance with digital communication system 11 (FIG. 2). In particular, FIG. 4 shows a frame 46 from framed stream of information bits 44. Frame 46 is established through a frame sync pattern 48 that is added by frame sync pattern generator 42 (FIG. 3). In the preferred embodiment, pattern 48 is a byte of predetermined data (e.g. 0100 0111). Pattern 48 repeats at predetermined intervals within framed stream of information bits 44 to indicate the beginning of frames 46. Each frame 46 may include many hundreds of bits of data.

Referring back to FIG. 3, framed stream of information bits 44 is supplied to an input of a parsing block 50. Parsing block 50 partitions framed stream of information bits 44 into a primary stream portion 52 and a secondary stream portion 54. In the preferred embodiments, PTCM encoder 18 applies convolutional encoding to secondary stream 54 and no further encoding to primary stream 52. However, in an alternate embodiment differential encoding may also be added to primary and secondary streams 52 and 54, respectively, for use by PTCM decoder 34 (FIG. 2) in resolving phase ambiguities. As discussed in more detail below, differential encoding is omitted in the preferred embodiment because phase ambiguities are resolved in a moderately quick manner without incurring the performance penalty imposed by the use of differential encoding.

PTCM encoder 18 may be adapted to operate over a wide variety of modulation formats and orders and to produce a wide variety of effective code rates. However, for the sake of clarity the below-presented discussion focuses on two preferred embodiments that adapt the present invention to an 8-PSK modulation format and order to achieve higher effective code rates of 5/6 and 8/9.

A unit interval of time is required by system 11 (FIG. 2) to communicate a single set of phase data. This unit interval represents the reciprocal of the baud rate. For each unit interval, parsing block 50 distributes at least two, and precisely two for the 8-PSK preferred embodiments, primary stream 52 user information bits to inputs of a phase mapping circuit 56. The inputs of phase mapper 56 are arranged from a least significant bit (LSB) to a most significant bit (MSB). FIG. 3 denotes an intermediate significant bit with the acronym "ISB." Primary stream 52 of the information bits drives the more significant bits of phase mapper 56. In other words, for the 8-PSK preferred embodiments, two primary stream bits drive the MSB and ISB of phase mapper 56 for each unit interval.

Parsing block 50 distributes less than one secondary stream 54 information bit to a convolutional encoder 58 for each unit interval. This low rate is accomplished by distributing only one secondary stream 54 information bit in some unit intervals and no secondary stream information bits in other unit intervals.

In the preferred embodiment, encoder 58 implements a transparent, K=7, rate 1/2 convolutional ("Viterbi") encoder. Encoder 58 may implement either a systematic or non-systematic code. Since encoder 58 implements a rate 1/2 code, two symbols, or convolutionally encoded bits, are produced for each information bit received from parsing block 50. However, other rate 1/N encoders, where N>1, may be substituted.

The outputs of encoder 58 couple in parallel to a multiplexer (MUX) 60. A select input of multiplexer 60 couples to a controller circuit 62, and an output of multiplexer 60 drives the LSB input of phase mapper 56. Multiplexer 60 serializes the output from encoder 58 to produce a secondary encoded stream of convolutionally encoded bits that drives the LSB input of phase mapper 56. Multiplexer 60 is configured so that exactly one (i.e. no more and no less than one) convolutionally encoded bit is mapped by phase mapper 56 during each unit interval.

Figure 5:
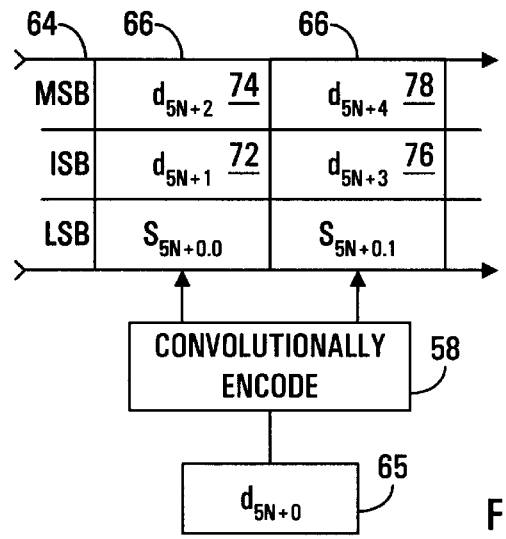
FIG. 5 shows a data flow diagram depicting the flow of certain data within a rate 5/6, 8-PSK embodiment of the PTCM encoder.

FIG. 5 shows a data flow diagram depicting the flow of information bits and coded symbols within a rate 5/6, 8-PSK embodiment of PTCM encoder 18. For the rate 5/6 embodiment, an interval set 64 includes two unit intervals 66. During each interval set 64, five information bits are mapped through phase mapper 56. During each interval set 64, parsing block 50 (FIG. 3) distributes only one information bit to convolutional encoder 58. This information bit is denoted as bit $d_{5N+0}$ in FIG. 5, and it represents the first occurring bit 65 in a rate 5/6 set 70, which is depicted in FIG. 4. Bit $d_{5N+0}$ is convolutionally encoded in encoder 58 to produce two symbols denoted as $s_{5N+0,0}$ and $s_{5N+0,1}$ in FIG. 5.

Second and third occurring bits 72 and 74, denoted as bits $d_{5N+1}$ and $d_{5N+2}$, respectively, are phase mapped through phase mapper 56 (FIG. 3) with symbol $s_{5N+0,0}$ during the first unit interval 66 of interval set 64. Fourth and fifth occurring bits 76 and 78, denoted as bits $d_{5N+3}$ and $d_{5N+4}$, respectively, are phase mapped through phase mapper 56 with symbol $s_{5N+0,1}$ during the second unit interval 66 of interval set 64. Accordingly, five information bits are provided and six bits are mapped during each interval set 64 to achieve a rate 5/6, 8-PSK modulation.

Referring to FIGS. 3 and 5, for this rate 5/6 preferred embodiment, controller 62 and multiplexer 60 are configured so that each convolutionally encoded bit $s_{5N+0,0}$ is mapped as soon as it is generated by convolutional encoder 58. Convolutionally encoded bit $s_{5N+0,1}$ is delayed until a subsequent unit interval 66, then mapped. All convolutionally encoded bits generated by encoder 58 are mapped; no convolutionally encoded bits are punctured.

Figure 6:
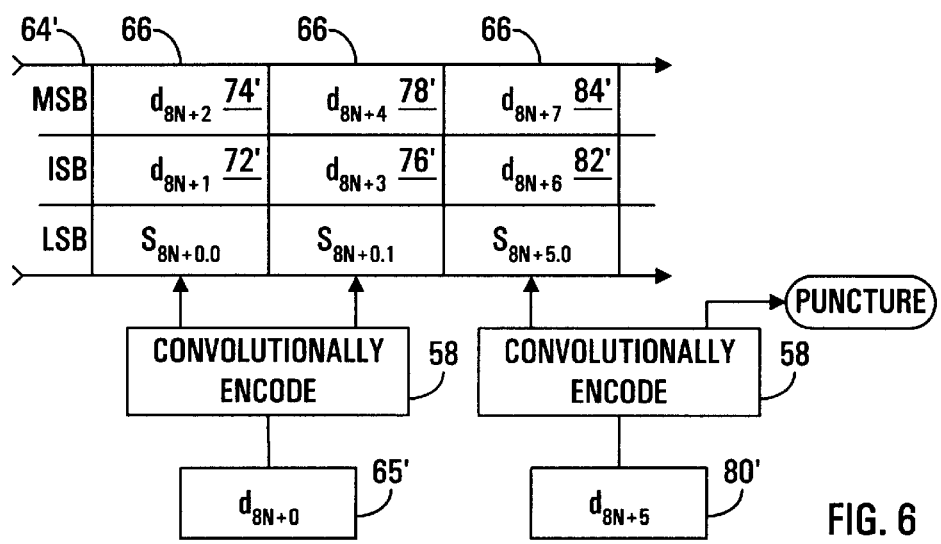
FIG. 6 shows a data flow diagram depicting the flow of certain data within a rate 8/9, 8-PSK embodiment of the PTCM encoder.

FIG. 6 shows a data flow diagram depicting the flow of information bits and coded symbols within a rate 8/9, 8-PSK embodiment of PTCM encoder 18. Referring to FIG. 3, 4 and 6, for the rate 8/9 embodiment, an interval set 64' includes three unit intervals 66. During each interval set 64', eight information bits are mapped through phase mapper 56. During each interval set 64', parsing block 50 distributes only two information bits to convolutional encoder 58. These information bits are denoted as bits $d_{8N+0}$ and $d_{8N+5}$ in FIG. 6. They represent the first occurring bit 65' and sixth occurring bit 80' in a rate 8/9 set 70', which is depicted in FIG. 4. Bit $d_{8N+0}$ is convolutionally encoded in encoder 58 to produce two symbols denoted as $s_{8N+0,0}$ and $s_{8N+0,1}$ in FIG. 6. Bit $d_{8N+5}$ is convolutionally encoded in encoder 58 to produce two symbols, but one of these symbols is punctured. The symbol that is not punctured is denoted as $s_{8N+5,0}$ in FIG. 6. The punctured symbol is simply ignored. It is neither mapped nor communicated outside PTCM encoder 18.

Second and third occurring bits 72' and 74', denoted as bits $d_{8N+1}$ and $d_{8N+2}$, respectively, are phase mapped through phase mapper 56 (FIG. 3) with symbol $s_{8N+0.0}$ during the first unit interval 66 of interval set 64'. Fourth and fifth occurring bits 76' and 78', denoted as bits $d_{8N+3}$ and $d_{8N+4}$, respectively, are phase mapped through phase mapper 56 with symbol $s_{8N+0.1}$ during the second unit interval 66 of interval set 64'. Seventh and eighth occurring bits 82' and 84', denoted as bits $d_{8N+6}$ and $d_{8N+7}$, respectively, are phase mapped through phase mapper 56 with symbol $s_{8N+5.0}$ during the third unit interval 66 of interval set 64'. Accordingly, eight information bits are provided and nine bits are mapped during each interval set 64' to achieve a rate 8/9, 8-PSK modulation.

Referring to FIGS. 3 and 6, for this rate 8/9 preferred embodiment, controller 62 and multiplexer 60 are configured so that each convolutionally encoded bit $s_{8N+0.0}$ is immediately mapped as soon as it is generated by convolutional encoder 58. Each convolutionally encoded bit $s_{8N+0.1}$ is delayed until a subsequent unit interval 66, then mapped. Each convolutionally encoded bit $s_{8N+5.0}$ is immediately mapped as soon as it is generated by convolutional encoder 58. However, one convolutionally encoded bit generated by encoder 58 per interval set 64' is punctured.

For the preferred embodiments, the interval set 64 or 64' includes at least two unit intervals 66, and less than one information bit is convolutionally encoded per unit interval 66. This permits one and only one convolutionally encoded bit to be mapped per unit interval. It also allows higher coding rates to be achieved with less puncturing than is required when two or more encoded bits are mapped per unit interval. Even though fewer bits are convolutionally encoded during each unit interval, a stronger code results when operating at low signal-to-noise ratios when compared to codes which require more puncturing.

FIG. 4 shows rate 5/6 set 70 and rate 8/9 set 70' together in a single frame 46 only for the purposes of illustration. In actual practice, rate 5/6 set 70 is repeated over and over throughout the entirety of frame 46 for a rate 5/6 implementation, and no rate 8/9 sets 70' occur. For a rate 8/9 implementation, rate 8/9 set 70' is repeated over and over throughout the entirety of frame 46, and no rate 5/6 sets 70 occur.

Referring to FIG. 3, phase mapper 56 is configured to concurrently map at least two information bits with one and only one convolutionally encoded bit. One mapping occurs for each unit interval 66 (FIGS. 5 and 6). Each mapping causes a phase point datum 86 to be produced. Each phase point datum 86 is characterized by quadrature components which exhibit a predetermined relative phase.

An integer "K" equals the number of bits being mapped and transmitted per unit interval. For the preferred 8-PSK embodiments, K equals three; but, K may also equal values greater than three. The integer K is not less than three because pragmatic codes are not applicable for QPSK and lower order modulations. Phase mapper 56 produces one of $2^K$ possible phase points 86 for each unit interval 66.

FIG. 3 illustrates a preferred phase map between input symbols and phase point data 86. As discussed above, inputs of phase mapper 56 are arranged from a least significant bit (LSB) to a most significant bit (MSB). Phase mapper 56 implements a binary code rather than the traditional Gray code. A binary code is characterized by the phase increasing at an increment of $2\pi/2^K$ as the input code increases by one. However, this is not the only code which will suffice for the purposes of the present invention. For codes employed by the preferred embodiments of the present invention, as phase point data 86 rotates, the least significant bit (LSB) of the input code alternates between zero and one for all adjacent phase points 88. One half of all pairs of adjacent phase points 88 have their two most significant bits (MSBs) in common. All pairs of adjacent phase points 88 are generated from pairs of opposing polarity LSB inputs. However, not all pairs of adjacent phase points 88 have their two MSBs in common.

As a result, all convolutionally encoded bits of a first polarity (e.g. a logical one) are mapped to a phase point 88 of $(2; n+1) (2\pi/2^K)$, and all symbols of a second polarity (e.g. a logical zero) are mapped to a phase point 88 of $(2n) (2\pi/2^K)$, where n is an integer in the range of zero through $2^{K-1}-1$.

Figure 7:
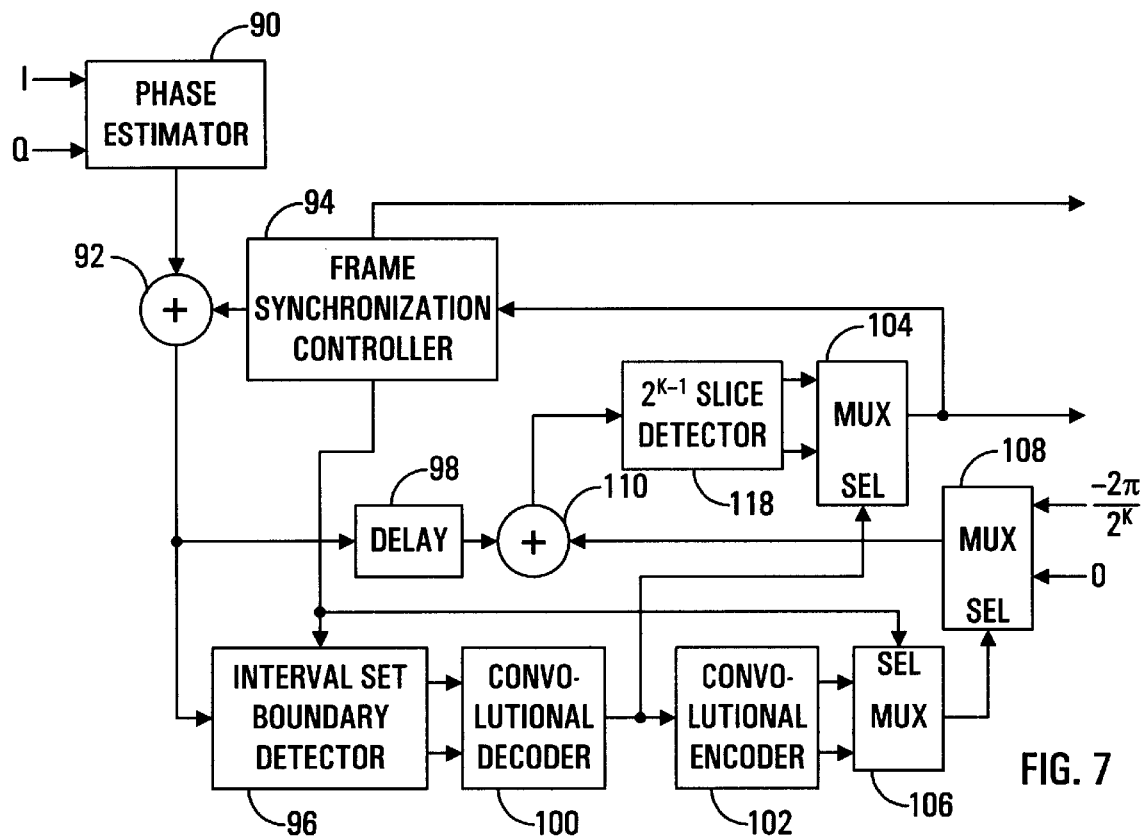
FIG. 7 shows a block diagram of a PTCM decoder portion of the digital communication system.

FIG. 7 shows a block diagram of PTCM decoder 34. Referring to FIG. 7, quadrature signal components from receiver 32 (FIG. 1) are supplied to a phase estimator 90. Phase estimator 90 estimates the phase indicated by the quadrature components. An estimated phase value is provided for each unit interval, and a stream of ambiguous phase estimates results. Each phase estimate conveys K symbols, where K>3, but precisely equal to three in the preferred 8-PSK embodiments. The estimated phase values are determined to a degree of precision that includes soft decision bits. For example, even though only three symbols are conveyed per unit interval in the preferred embodiment discussed herein, phase estimator 90 may characterize estimated phase values to a precision of 5–10 bits per phase value.

The phase estimates provided by phase estimator 90 are ambiguous because they are made without receiver 32 (FIG. 1) being aware of an absolute phase reference. Since no absolute phase reference is known, the ambiguous phase estimates are offset from theoretical unambiguous phase estimates by $(N)^*(2\pi/2^K)$, where N is any integer in the range of 0 to $2^K-1$. Accordingly, the phase ambiguity needs to be resolved before user information can be recovered.

The estimated phase values from phase estimator 90 are supplied to a first input of a phase rotator 92. Phase rotator 92 has a second input which couples to a frame synchronization controller 94. As discussed in more detail below, frame synchronization controller 94 supplies an offset angle by which the ambiguous phase estimate stream is rotated in phase rotator 92 to resolve the ambiguity. Thus, phase rotator 92 provides an ambiguity-resolved phase stream.

The ambiguity-resolved phase stream from phase rotator 92 is supplied to an interval set boundary detector 96 and to a delay block 98. Detector 96 and delay block 98 may, but need not, receive the same sets of bits produced for each estimated ambiguity-resolved phase value. For example, detector 96 may receive bits of lesser significance while delay block 98 receives bits of greater significance, with considerable overlap between the two sets.

Detector 96 groups pairs of ambiguity-resolved estimated phase values for presentation to a rate 1/2 convolutional ("Viterbi") decoder 100. Each pair of estimated phase values conveys convolutionally encoded bits $s_{5N+0.0}$ and $s_{5N+0.5}$ produced in response to a single information bit for the above-discussed rate 5/6 preferred embodiment.

Referring to FIGS. 6 and 7, for the above-discussed rate 8/9 preferred embodiment, detector 96 also inserts erasure values at appropriate locations in the ambiguity-resolved phase estimate stream. Erasure values are dummy phase values that desirably indicate a phase intermediate to adjacent phase points 88 (FIG. 3). Those appropriate locations correspond to the convolutionally encoded bit that was punctured in PTCM encoder 18 (FIG. 3). In the rate 8/9 embodiment, for a given interval set 64', decoder 96 groups convolutionally encoded bits $s_{8N+0.0}$ and $s_{8N+0.5}$ together for presentation to convolutional decoder 100 after the second of the three unit intervals 66 in interval set 64'. After the third of the three unit intervals 66 in interval set 64', decoder 96 presents convolutionally encoded bit $s_{8N+5.0}$ with a puncture erasure value to convolutional decoder 100.

Detector 96 couples to and receives a timing signal from frame synchronization controller 94. This timing signal defines the temporal boundaries of interval sets 64 or 64'. For example, this timing signal can indicate the beginning of each interval set 64 or 64'.

Convolutional decoder 100 performs a complementary operation to that performed by convolutional encoder 58 (FIG. 3). Accordingly, convolutional decoder 100 produces one information bit estimate for each pair of phase value estimates it receives from detector 96. In other words, decoder 100 produces secondary stream of decoded data estimates at a rate of 1/N estimates per unit interval, where N>1. In the preferred rate 5/6 embodiment, decoder 100 produces one decoded data stream estimate for every interval set 64 (FIG. 5). In the preferred rate 8/9 embodiment, decoder 100 produces two decoded data stream estimates for every interval set 64' (FIG. 6). Those skilled in the art will appreciate that convolutional decoder 100 may process each pair of ambiguity-resolved estimated phase values over numerous unit intervals 66 (e.g. typically more than 64) before generating a data estimate.

An output of convolutional decoder 100 provides the secondary decoded data estimate stream to a rate 1/2, transparent, convolutional encoder 102 and to a data input of a multiplexer 104. Convolutional encoder 102 is desirably identical to convolutional encoder 58 of PTCM encoder 18 (FIG. 3). If convolutional encoder 58 implements a given rate 1/N code, with N>1, then convolutional encoder 102 implements that same code. Accordingly, if the secondary decoded data estimate stream correctly estimates secondary user information bit stream 54 (FIG. 3), then a secondary stream of symbol estimates produced by convolutional encoder 102 includes symbol estimates that equal corresponding symbols produced by convolutional encoder 58 in PTCM encoder 18. A pair of symbol estimates are produced by encoder 102 every interval set 64 for the rate 5/6 embodiment. Two pairs of symbol estimates are produced by encoder 102 every interval set 64' for the rate 8/9 embodiment.

Encoder 102 couples to a multiplexer (MUX) 106. In addition, frame synchronization controller 94 couples to a select input of multiplexer 106. Multiplexer 106 serializes the secondary stream of symbol estimates in a manner like that described above for multiplexer 60 (FIG. 3). For the rate 8/9 embodiment, this includes puncturing one symbol estimate per interval set 64', as discussed above in connection with multiplexer 60.

The serialized secondary symbol estimates are used to selectively rotate the estimated phase values from the ambiguity-resolved estimated phase value stream. Rotation is in an amount of either zero or $-2\pi/2^K$, where K is equal to the number of symbols transmitted per unit interval and is greater than two. Whether rotation is to be applied or not for each unit interval 66 is determined in response to the polarity of the estimated secondary stream symbol for that unit interval 66.

In particular, an output from multiplexer 106 couples through a multiplexer (MUX) 108 to a phase rotator summation circuit 110. The serialized estimated secondary symbol stream from multiplexer 106 controls a selection input of multiplexer 108. This selection input selects a constant phase value of either zero or $-2\pi/2^K$ for application to phase rotator 110. In the preferred 8-PSK embodiments, K=3 and $2^K=8$. Phase rotator 110 also receives the ambiguity-resolved estimated phase values from phase rotator 92 delayed through delay block 98. Delay block 98 delays estimated phase values by a sufficient duration to achieve coincidence between symbols of the primary and secondary streams. Coincidence is achieved when a secondary symbol estimate from multiplexer 106 is output at the same instant the ambiguity-resolved phase estimate value which conveyed the secondary symbol estimate is output from delay block 98.

Phase rotator 110 removes the secondary modulation from the ambiguity-resolved phase value, leaving the primary modulation. An output of phase rotator 110 provides a $2^{K-1}$ phase value stream.

Figure 8:
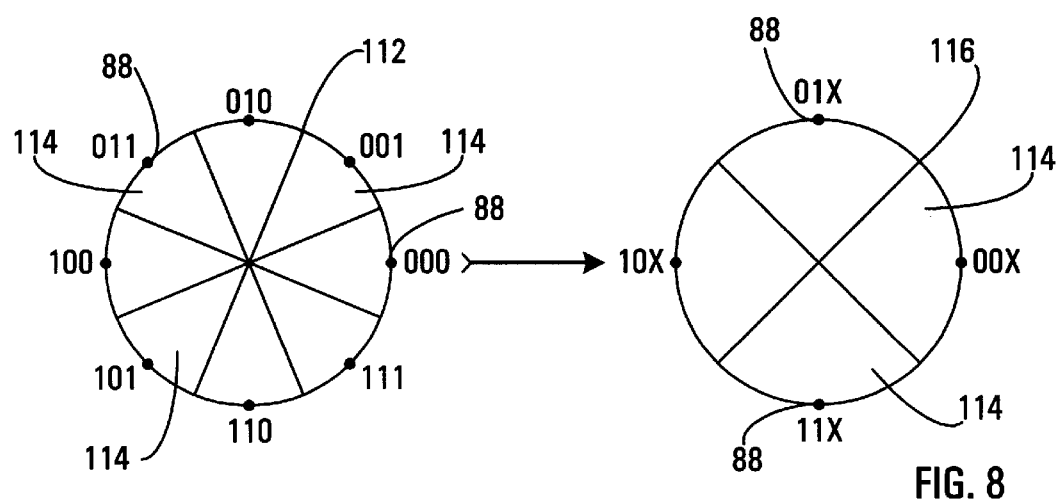
FIG. 8 shows a modification of a phase constellation which occurs through the operation of a phase rotator portion of the PTCM decoder.

FIG. 8 shows the modification of a phase constellation which occurs through the operation of phase rotator 110 for the 8-PSK preferred embodiments. A phase constellation 112 illustrates a $2^K$ constellation represented by the ambiguity-resolved phase estimate stream, where K equals three. Constellation 112 results from the mapping performed by phase mapper 56 (FIG. 3) and corruption by noise in communication channel 28 (FIG. 2). Constellation 112 can be divided into sectors 114, with one phase point 88 per sector 114. Sectors 114 occupy a relatively small area in constellation 112, and errors in determining the sector in which any given phase estimate may reside are relatively more likely. Phase rotator 110 converts $2^K$ constellation 112 into a $2^{K-1}$ constellation 116. Fewer sectors 114 are now presented. Sectors 114 now occupy a relatively large area in constellation 116, and errors in determining the sector 114 in which any given phase estimate may reside are relatively less likely.

Referring back to FIG. 7, an output of phase rotator 110 provides a $2^{K-1}$ phase value stream to an input of a $2^{K-1}$ slice detector 118. Slice detector 118 performs a $2^{-1}$-PSK (K=3 in the preferred embodiments) demodulation to estimate the polarity of the K−1 primary stream 52 (FIG. 3) user information bits conveyed for each unit interval 66. In the 8-PSK preferred embodiments, this is a QPSK detection. Slice detector 118 is a well known component in digital communications, and is sometimes referred to as a pruner, a slicer, a sector determination block, a demodulator, and the like. Slice detector 118 detects the one of $2^{K-1}$ possible sectors 114 (FIG. 8) in which each unit interval's $2^{K-1}$ phase estimate value may reside. Outputs from slice detector 118 are referred to as "hard decisions".

The outputs from $2^{K-1}$ slice detector 118 couple to data inputs of multiplexer 104. Multiplexer 104 collects decoded estimates of primary information bit stream 52 (FIG. 3) with estimates of secondary information bit stream 54 (FIG. 3) to provide a serial decoded data estimate stream to deinterleaver 36 (FIG. 2). In addition, this serial decoded data estimate stream is provided to a data input of frame synchronization controller 94. A sync signal output from controller 94 is also provided to deinterleaver 36. The sync signal informs deinterleaver 36 of frame timing, which allows deinterleaver 36 to be synchronized with interleaver 16 (FIG. 2).

Figure 9:
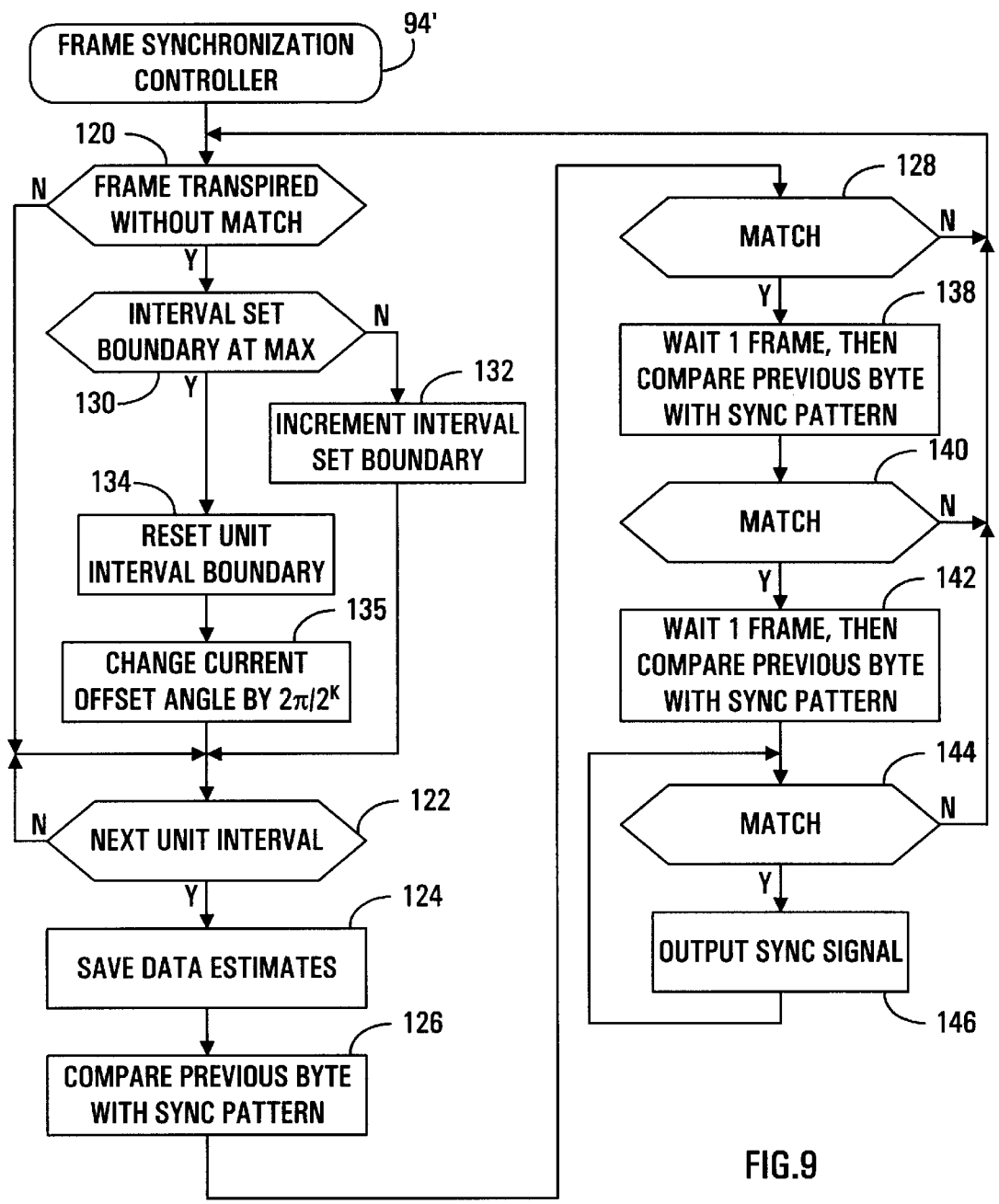
FIG. 9 shows a flow chart of tasks performed to implement a frame synchronization controller of the PTCM decoder.

FIG. 9 shows a flow chart of tasks performed by a frame synchronization controller process 94' performed by frame synchronization controller 94 (FIG. 7). Controller 94 may be implemented in any convenient manner to perform process 94'.

Referring to FIG. 9, process 94' performs a query task 120 to determine whether, at the instant task 120 is performed, an entire frame 46 (FIG. 4) or longer has transpired without detecting frame sync pattern 48 (FIG. 4) in the serial decoded data estimate stream obtained from multiplexer 104 (FIG. 7). If a frame 46 has not yet transpired, a query task 122 is performed. Process 94' waits at task 122 until a new unit interval 66 occurs. When the next unit interval 66 occurs, a task 124 saves the data estimates available from the K bits obtained from the serial decoded data estimate stream for this unit interval 66, where K is the number of symbols decoded by PTCM decoder 34 (FIGS. 2 and 7) for the unit interval 66 and where K is greater than two. Next, a task 126 compares the previous byte, or eight bits, with the predetermined sync pattern 48.

Following task 126, a query task 128 determines whether the comparison of task 126 resulted in a match or near match. Because the inner code decoded by PTCM decoder 34 provides only a modest BER, frame sync pattern 48 may occasionally be received with one and rarely received with two bit errors. Accordingly, task 128 may desirably determine whether six of the eight previously received bits match corresponding bits in frame sync pattern 48. If no match is found, program control returns to task 120, where process 94' will continue to monitor the serial decoded data estimate stream for the occurrence of frame sync pattern 48.

Eventually, task 120 will indicate that a frame 46 has transpired without detecting frame sync pattern 48. This situation occurs prior to resolving phase ambiguity or when a previously resolved phase ambiguity offset angle no longer resolves the phase ambiguity. When the duration of a frame 46 has transpired, a query task 130 determines whether the interval set 64 or 64' boundary is at a maximum. For the rate 5/6 embodiment, the maximum is two unit intervals 66 and for the rate 8/9 embodiment, the maximum is three unit intervals 66. Accordingly, an interval set boundary can be controlled by adding an offset of zero or one to a modulo two counter for the rate 5/6 embodiment and an offset of zero, one or two to a modulo three counter for the rate 8/9 embodiment. The maximum may be reached when the offset is the maximum allowed value.

When the interval set boundary is found not to be at a maximum, a task 132 increments the interval set boundary. This causes interval set boundary detector 96 (FIG. 7) to alter an established temporal interval set 64 or 64' boundary. In other words, detector 96 will henceforth perform a different grouping of phase value estimate pairs to present to convolutional decoder 100 (FIG. 7). After task 132, program control proceeds to task 122 to await the next unit interval and continue monitoring for frame sync pattern 48.

When the interval set boundary is found to be at a maximum, a task 134 resets the unit interval boundary to an initial condition. Task 134 also causes interval set boundary detector 96 to perform a different grouping of phase value estimate pairs to present to convolutional decoder 100. In conjunction with task 134, a task 136 changes the current offset angle used by phase rotator 92 (FIG. 7). Task 136 changes the currently used offset angle by an integer multiple of $2\pi/2^K$ radians. For example, task 136 may simply increment or decrement the current offset angle by a discrete step of $2\pi/2^K$ radians. This change in offset angle causes phase rotator 92 to henceforth rotate the ambiguous phase estimate stream by an offset angle that is an integer multiple of $2\pi/2^K$ radians and is different from the offset angle used for at least the previous frame 46. After task 136, program control proceeds to task 122 to await the next unit interval and continue monitoring for frame sync pattern 48.

Tasks 128 and 130 together provide control points for a nested programming loop. An inner loop alters interval set 64 or 64' boundaries when a frame transpires without detecting frame sync pattern 48, and an outer loop adjusts an ambiguity resolution offset angle when all possible interval set boundaries have been tried without detecting frame sync pattern 48.

Eventually, task 128 will detect the occurrence of a data pattern that might possibly be frame sync pattern 48. When this happens, a task 138 causes process 94' to wait the duration of one frame 46, then compare the previously received byte to determine whether it matches or nearly matches frame sync pattern 48. Following task 138, a query task 140 determines whether task 138 found a match or near match. A match or near match is unlikely when task 128 actually discovers random data that happened to match frame sync pattern 48. Accordingly, when no match is indicated, program control loops back to task 120 to continue monitoring every unit interval 66 for frame sync pattern 48.

However, when two detections occur at the proper interval, then a high probability exists that frame sync pattern 48 has been discovered. When task 140 detects a match, a task 142 causes process 94' to again wait the duration of one frame 46, then compare the previously received byte to determine whether it again matches or nearly matches frame sync pattern 48. Following task 142, a query task 144 determines whether task 142 found a match or near match. A match or near match is unlikely when process 94' is encountering random data that happens to match frame sync pattern 48. Accordingly, when no match is indicated, program control loops back to task 120 to continue monitoring every unit interval 66 for frame sync pattern 48.

However, when three detections occur at the proper intervals, then a very high probability exists that frame sync pattern 48 has been discovered. When task 144 detects a match, a task 146 outputs the sync signal which specifies to deinterleaver 36 (FIG. 2) the proper framing for frame 46. In order for frame sync pattern 48 to be correctly detected, phase ambiguity had to be resolved and the interval set 64 or 64' boundary correctly determined. Accordingly, no further alterations are made to the established interval set boundary or offset angle as long as PTCM decoder 34 remains synchronized. After task 146, program control loops back to task 144 to test for frame sync pattern 48 in the next frame 46. So long as frame sync pattern 48 continues to be detected at the proper timing, PTCM decoder 34 remains synchronized, and process 94' remains at tasks 144 and 146. When synchronization is lost, program flow returns to task 120 to regain synchronization.

In summary, the present invention provides an improved pragmatic encoder and encoding method which are useful in a digital communication system. The encoder achieves a modest BER at a respectably low signal-to-noise ratio. The encoder is configured to support phase ambiguity resolution in a decoder without differentially encoding user information. Consequently, BER performance does not suffer due to the undesirable use of differential encoding. A concatenated encoder is provided which better matches inner and outer codes to achieve a desirable overall BER at a low signal-to-noise ratio.

The present invention has been described above with reference to preferred embodiments. However, those skilled in the art will recognize that changes and modifications may be made in these preferred embodiments without departing from the scope of the present invention. These and other changes and modifications which are obvious to those skilled in the art are intended to be included within the scope of the present invention.

What is claimed is:

1. An apparatus for pragmatically encoding information bits to be communicated at a rate of three or more bits per unit interval, said apparatus comprising:

a parsing circuit for distributing said information bits;

a convolutional encoder coupled to said parsing circuit, said convolutional encoder being configured to produce at least two convolutionally encoded bits for each information bit processed through said convolutional encoder;

a phase mapping circuit coupled to said parsing circuit, said phase mapping circuit being configured to receive at least two of said information bits from said parsing circuit per unit interval; and a multiplexing circuit, coupled between said convolutional encoder and said phase mapping circuit, said multiplexing circuit being configured to route no more than one of said convolutionally encoded bits produced for each information bit received by said convolutional encoder to said phase mapping circuit per unit interval.

2. An apparatus as claimed in claim 1 additionally comprising:

a block encoder coupled to said parsing circuit so that said information bits are generated from said block encoder and said apparatus provides concatenated encoding.

3. An apparatus as claimed in claim 1 wherein:

said phase mapping circuit has data inputs arranged from a least significant bit to a most significant bit; and said multiplexer couples to said least significant bit of said phase mapping circuit.

4. An apparatus as claimed in claim 1 wherein:

said phase mapping circuit has data inputs arranged from a least significant bit to a most significant bit; and said phase mapping circuit is configured so that pairs of adjacent phase data mapped by said phase mapping circuit are generated from pairs of opposing polarity least significant bit inputs.

5. An apparatus as claimed in claim 4 wherein said multiplexer couples to said least significant bit data input of said phase mapping circuit so that said convolutionally encoded bits drive said least significant bit data input of said phase mapper.

6. An apparatus as claimed in claim 1 wherein said multiplexing circuit is further configured to route no less than one of said convolutionally encoded bits produced for each information bit received by said convolutional encoder to said phase mapping circuit per unit interval.

7. An apparatus as claimed in claim 1 wherein:

said parsing circuit distributes one information bit to said convolutional encoder for each two unit intervals;

said parsing circuit distributes four information bits to said phase mapping circuit for each two unit intervals;

said convolutional encoder produces two convolutionally encoded bits for each two unit intervals; and said phase mapping circuit maps three bits for each unit interval so that said information bits are encoded in accordance with rate 5/6, 8-PSK modulation.

8. A pragmatic encoding method for coding information bits to be digitally communicated at a rate of three or more bits per unit interval, said method comprising the steps of:

distributing a first portion of said information bits to a phase mapping circuit and a second portion of said information bits to a convolutional encoder, said first portion comprising at least two bits per unit interval and said second portion comprising less than one bit per unit interval;

convolutionally encoding said second portion of said information bits so that at least one convolutionally encoded bit is produced per unit interval; and phase mapping said first portion of said information bits and said convolutionally encoded bits so that no more than one convolutionally encoded bit is mapped per unit interval.

9. A pragmatic encoding method as claimed in claim 8 additionally comprising the step of block encoding said information bits prior to said distributing step to provide a concatenated code.

10. A pragmatic encoding method as claimed in claim 8 wherein:

said phase mapping step is performed by a phase mapping circuit having data inputs arranged from a least significant bit to a most significant bit;

said convolutionally encoding step produces a convolutionally encoded data stream; and said convolutionally encoded data stream drives said least significant bit of said phase mapping circuit.

11. A pragmatic encoding method as claimed in claim 8 wherein:

said phase mapping step is configured to map a total of K bits during each unit interval, where K is an integer number greater than two, and said K bits are collectively obtained from said first portion of said information bits and said convolutionally encoded bits; and said mapping step is further configured so that convolutionally encoded bits of a first polarity are mapped to a phase of approximately $(2n+1)(2\pi/2^K)$, and convolutionally encoded bits of a second polarity are mapped to a phase of approximately $(2n)(2\pi/2^K)$, where n is an integer in the range of 0 to $2^{K-1}-1$.

12. A pragmatic encoding method as claimed in claim 8 wherein said phase mapping step maps no less than one convolutionally encoded bit per unit interval.

13. A pragmatic encoding method as claimed in claim 8 wherein:

said distributing step distributes one information bit to said convolutional encoder for each two unit intervals;

said distributing step distributes four information bits to said phase mapping circuit for each two unit intervals;

said convolutionally encoding step produces said convolutionally encoded bits at a rate of one convolutionally encoded bit per unit interval; and said phase mapping step maps three bits per unit interval so that said information bits are encoded in accordance with rate 5/6, 8-PSK modulation.

14. A pragmatic encoding method for coding information bits to be digitally communicated at a rate of three or more bits per unit interval, said method comprising the steps of:

block encoding said information bits to provide block encoded information bits;

distributing a first portion of said block encoded information bits to a phase mapping circuit and a second portion of said block encoded information bits to a convolutional encoder, said first portion comprising at least two bits per unit interval and said second portion comprising less than one bit per unit interval;

convolutionally encoding said second portion of said block encoded information bits so that at least one convolutionally encoded bit is produced per unit interval; and phase mapping said first portion of said block encoded stream of information bits and said convolutionally encoded bits so that no more or less than one convolutionally encoded bit is mapped per unit interval.

15. A pragmatic encoding method as claimed in claim 14 wherein:

said phase mapping step is configured to process a total of K bits during each unit interval, where K is an integer number greater than two, and said K bits are collectively obtained from said first portion of said block encoded information bits and said convolutionally encoded bits; and said mapping step is further configured so that convolutionally encoded bits of a first polarity are mapped to a phase of approximately $(2n+1)(2\pi/2^K)$, and convolutionally encoded bits of a second polarity are mapped to a phase of approximately $(2n)(2\pi/2^K)$, where n is an integer in the range of 0 to $2^{K-1}-1$.

* * * * *